United States Patent [19]
Nagano

[11] Patent Number: 5,416,441
[45] Date of Patent: May 16, 1995

[54] AUTOMATIC CONTROL CIRCUIT FOR POWER AMPLIFIER

[75] Inventor: Hiroaki Nagano, Hyogo, Japan

[73] Assignee: Mitsubishi Denki Kabushiki Kaisha, Tokyo, Japan

[21] Appl. No.: 197,324

[22] Filed: Feb. 16, 1994

[30] Foreign Application Priority Data

Feb. 17, 1993 [JP] Japan .................... 5-051386

[51] Int. Cl.[6] .............................................. H03G 3/20
[52] U.S. Cl. ...................................... 330/129; 455/126
[58] Field of Search ............... 330/129, 137, 140, 141; 455/126

[56] References Cited

U.S. PATENT DOCUMENTS

| | | | |
|---|---|---|---|
| 4,859,964 | 8/1989 | Jorgensen | 330/129 X |
| 5,159,283 | 10/1992 | Jensen | 330/129 |
| 5,194,822 | 3/1993 | Bureau et al. | 330/129 |

FOREIGN PATENT DOCUMENTS

| | | |
|---|---|---|
| 0261967 | 3/1988 | European Pat. Off. . |
| 0405445 | 1/1991 | European Pat. Off. . |
| 0414352 | 2/1991 | European Pat. Off. . |
| 0509733 | 10/1992 | European Pat. Off. . |
| 0541351 | 5/1993 | European Pat. Off. . |
| 9112661 | 8/1991 | WIPO . |

OTHER PUBLICATIONS

Patent Abstracts of Japan, vol. 13, No. 110 & JP A 63 283 218 Mitsubishi Electric.

*Primary Examiner*—Steven Mottola
*Attorney, Agent, or Firm*—Rothwell, Figg, Ernst & Kurz

[57] ABSTRACT

Deformed rises and overshoots in the waveform of an RF output signal in the burst transmission mode are prevented by short-circuiting both ends of the capacitor of a low-pass filter with a switch having a control terminal, before the start of transmission.

6 Claims, 6 Drawing Sheets

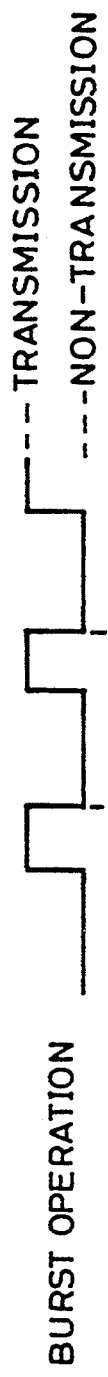
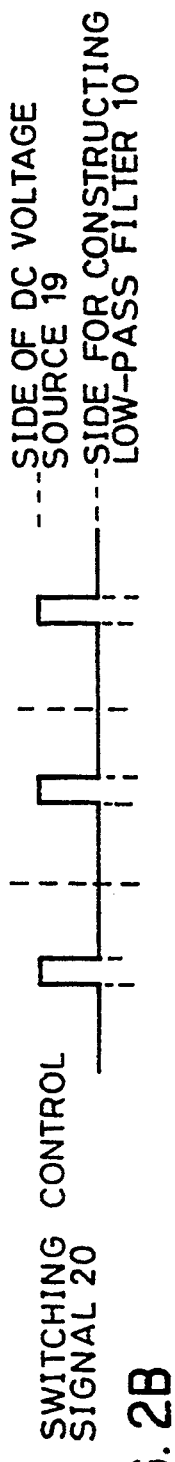
FIG. 2A  BURST OPERATION
FIG. 2B  SWITCHING CONTROL SIGNAL 20
FIG. 2C  VOLTAGE OF CAPACITOR 21 OF LOW-PASS FILTER 10

AUTOMATIC CONTROL CIRCUIT FOR POWER AMPLIFIER

BACKGROUND OF THE INVENTION

1. Field of the Invention

The present invention relates to an automatic control circuit for a power amplifier for use in digital cellular mobile telephone systems and portable telephones.

2. Description of the Prior Art

FIG. 6 is a diagram of an automatic control circuit for a power amplifier of the prior art which is used for burst transmission in digital cellular mobile telephone systems and portable telephones. In FIG. 6, reference numeral 1 represents a baseband signal, 2 an oscillator for generating a carrier wave, 3 a modulator for modulating the carrier wave 2 with the baseband signal 1, 4 a radio frequency signal output from the modulator 3, and 5 a power Amplifier for amplifying the radio frequency signal 4 and having a gain control terminal 5a. Reference numeral 6 represents a radio frequency output signal (referred to as "RF output signal" hereinafter) amplified by the power amplifier 5, 7 a detector for detecting the envelope waveform of the RF output signal, 8 a reference signal voltage generator for generating the waveform of a reference signal voltage 31, 9 a comparator for detecting the difference between the waveform detected by the detector 7 and the waveform of the reference signal voltage 31, and 10 a low-pass filter for filtering an error signal 32 output from the comparator 9 and supplying the error signal 32 to the gain control terminal 5a of the power amplifier 5. The reference signal voltage generator 8 comprises a D/A converter 12 for converting digital data into analog data to output the reference signal voltage 31, a waveform generating ROM 13 for storing data 33 to be supplied to the D/A converter 12, a counter 14 for specifying an address in the ROM 13, and a RAMP controller 15 for outputting a signal for controlling a transmission waveform at the start and end of burst transmission to the counter 14. Reference numeral 16 represents a transmission control signal for controlling the counter 14 and the ROM 13, and 17 a power level control signal for controlling the ROM 13.

A description is subsequently given of the operation of the prior art. The baseband signal 1 is modulated by the modulator 3 together with the carrier wave from the oscillator 2 to become the radio frequency output signal 6 (referred to as "RF output signal" hereinafter). This RF output signal 6 is amplified by the power amplifier 5 (abbreviated as PA hereinafter), and transmitted through an isolator, a duplexer and an antenna. For the purpose of effecting an optimal and stable transmission, the waveform of the RF output signal 6 amplified by the PA 5 is detected by the detector 7, and this detected output and the reference signal voltage 31 from the reference signal voltage generator 8 are compared by the comparator 9 to output an error signal voltage 32 which is then fed back to the gain control terminal 5a of the PA 5 through the low-pass filter 10. Furthermore, the reference signal voltage generator 8 operates in such a manner that the waveform-generating ROM 13 and the counter 14 are activated by the transmission control signal 16 at the start of transmission and a CLK signal is then inputted into the counter 14 so that the counter 14 begins to count and specifies the address of the waveform data 33 prestored in the waveform generating ROM 13. The waveform-generating ROM 13 stores waveform data 33 for each transmission power level and switches data in response to a power level control signal 17. When an address in the waveform-generating ROM 13 is specified, the waveform data 33 at the specified address is input into the D/A converter 12 to output the waveform of the reference signal voltage 31. For the purpose of preventing the expansion of a spectrum caused by drastic changes in the waveform of the RF output signal 5, such as the steep rises and falls that occur in the burst transmission mode, the counter 14 is controlled by the RAMP controller 15 upon input of the CLK signal at the start and end of transmission to generate the reference signal voltage 31 by which rises and falls in the waveform of the RF output signal 6 can be smoothed.

Since there is an offset voltage in the comparator 9 used in the automatic control circuit for a transmission power amplifier of the prior art, an undesirable charge is accumulated in the capacitor of the low-pass filter 10 at the time of non-transmission in the burst transmission mode. An undesirable charge is accumulated in the capacitor especially when the automatic control circuit for the power amplifier is turned off at the time of non-transmission for the purpose of power saving. If transmission starts in this state, the gain control of the power amplifier 5 cannot be performed precisely as response of the low-pass filter 10 is unstable, resulting in the occurrence of undesirable changes in the waveform of the RF output signal 6 such as deformed rises and overshoots.

SUMMARY OF THE INVENTION

The present invention is intended to solve the above problem, and it is therefore an object of the invention to provide an automatic control circuit for a power amplifier which can effect optimal and stable control of transmission output even if an offset voltage or the like is generated in the comparator.

According to a first aspect of the present invention, there is provided an automatic control circuit for a power amplifier which comprises means (initializing means 37) for initializing a low-pass filter (low-pass filter 10).

According to a second aspect of the present invention, there is provided an automatic control circuit for a power amplifier wherein means for initializing a low-pass filter (low-pass filter 10) consists of a circuit for connecting a DC voltage source (DC voltage source 19) corresponding to an initial value to both ends of a capacitor (capacitor 21) constituting the low-pass filter (low-pass filter 10).

According to a third aspect of the present invention, there is provided an automatic control circuit for a power amplifier wherein a low-pass filter (low-pass filter 10) comprises a capacitor (capacitor 21) located between the negative input terminal and output terminal of a comparator (comparator 9) and initializing means (initializing means 37) comprises a switch (analog switch 35) for discharging the capacitor (capacitor 21).

According to a fourth aspect of the invention, there is provided an automatic control circuit for a power amplifier which uses a digital filter (digital filter 26) as a low-pass filter for processing a digital signal in a CPU (CPU 24) and which comprises means (initializing means 37) for initializing the digital filter immediately before the start of transmission.

In the first aspect of the invention, the low-pass filter (low-pass filter 10) is initialized immediately before the start of transmission.

In the second aspect of the invention, the DC voltage source (DC voltage source 19) corresponding to an initial value is connected to both ends of the capacitor (capacitor 21) immediately before the start of transmission to initialize the low-pass filter (low-pass filter 10).

In the third aspect of the invention, the low-pass filter (low-pass filter 10) comprises the capacitor (capacitor 21) located between the negative input terminal and the output terminal of the comparator (comparator 9) and is initialized by short-circuiting the capacitor (capacitor 21) with the switch (analog switch 35) immediately before the start of transmission.

In the fourth aspect of the invention, the digital filter (digital filter 26) for processing a digital signal in the CPU (CPU 24) is used as a low-pass filter and initialized immediately before the start of transmission.

The above and other objects, features and advantages of the invention will become more apparent from the following description when taken in conjunction with the accompanying drawings.

BRIEF DESCRIPTION OF THE DRAWINGS

FIGS. 2A–2C are timing charts showing the switching control signal of Embodiment 1;

DESCRIPTION OF THE PREFERRED EMBODIMENT

EMBODIMENT 1.

Figure 1:
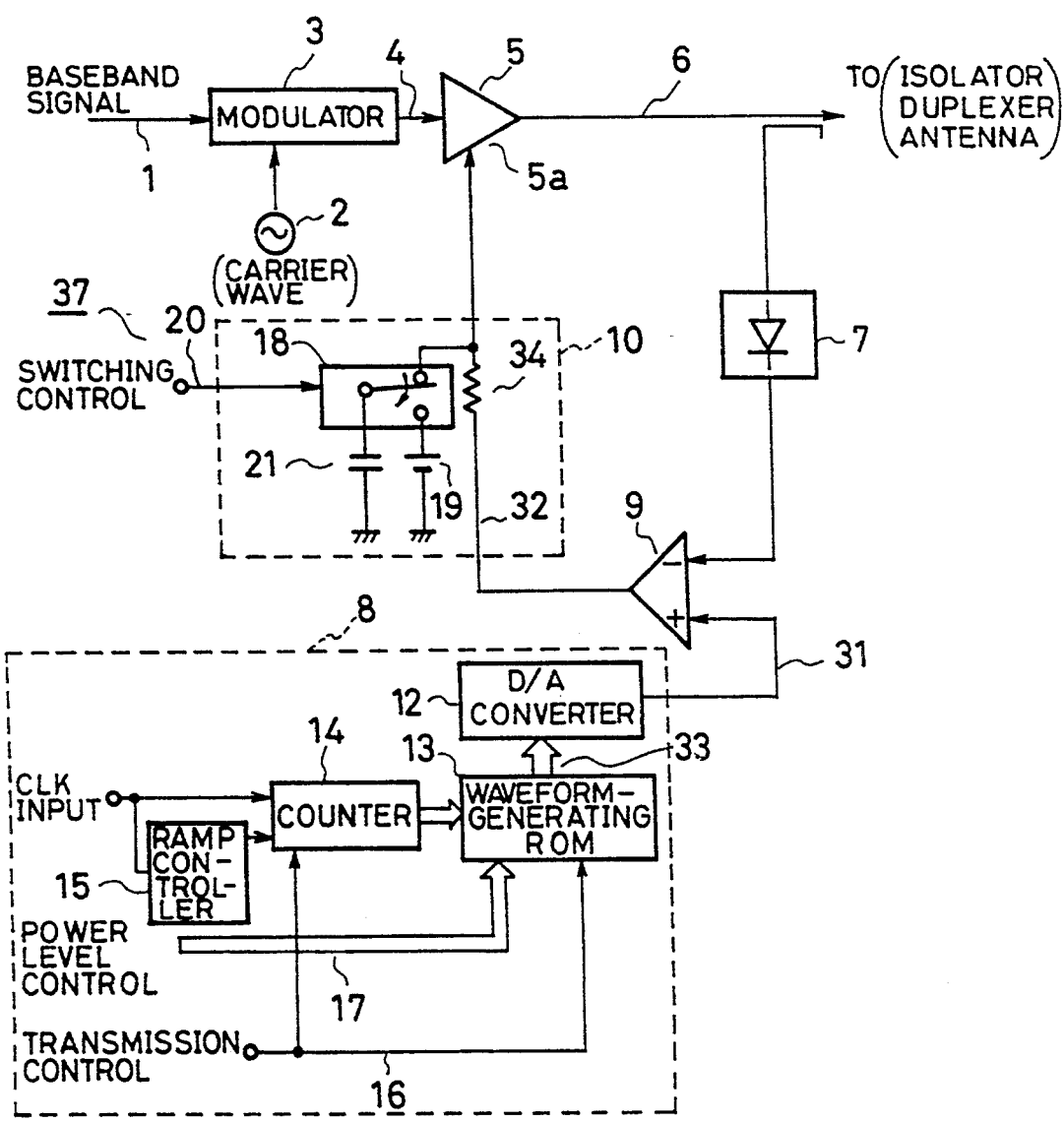
FIG. 1 is a diagram of an automatic control circuit for a power amplifier according to Embodiment 1 of the invention.
Figure 6:
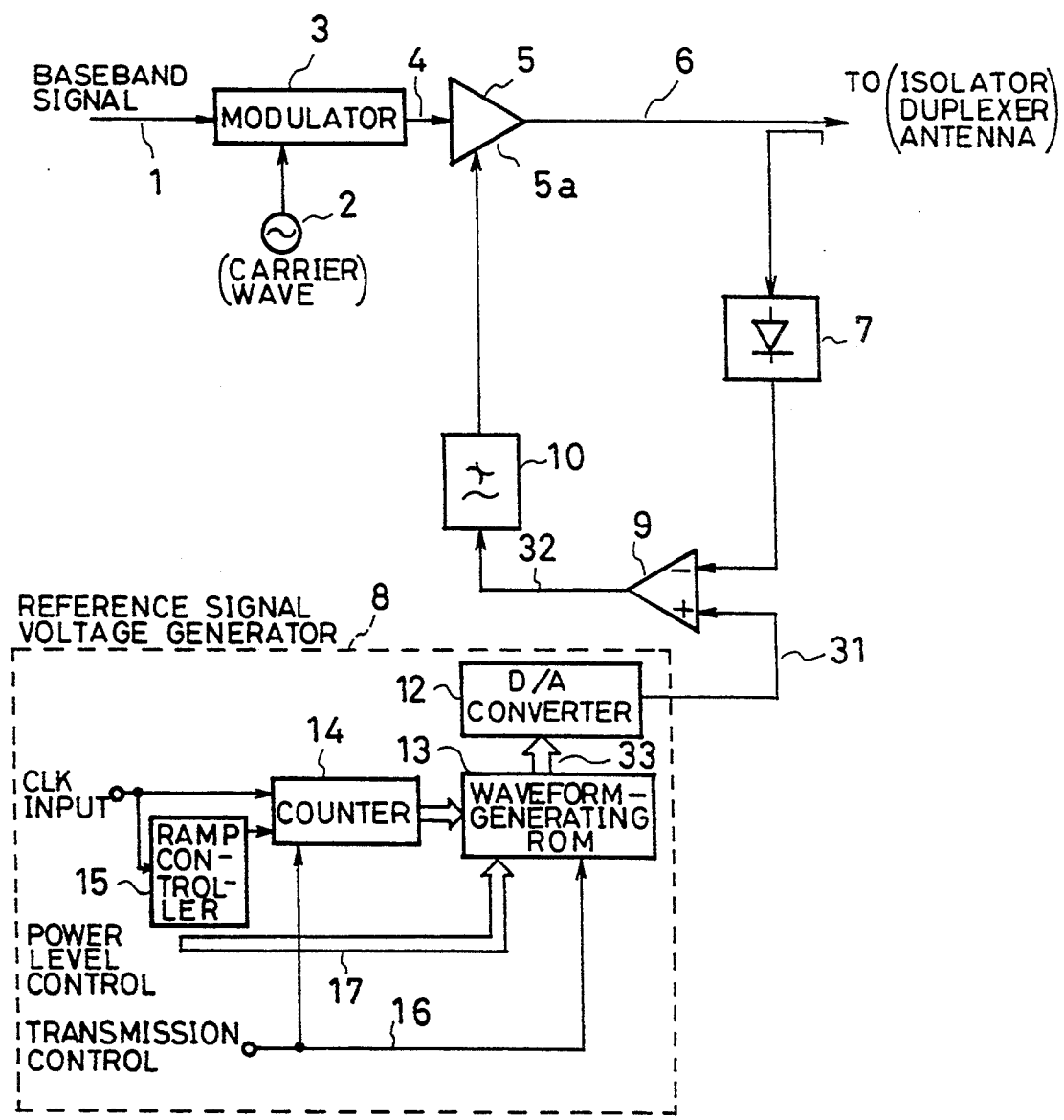
FIG. 6 is a diagram of an automatic control circuit for a power amplifier of the prior art.

FIG. 1 shows an automatic control circuit for a power amplifier according to one embodiment of the present invention. Reference numerals 1 to 17 and 31 to 33 represent the same components as those of the prior art shown in FIG. 6, and, accordingly, their descriptions are omitted. Reference numeral 18 represents a switch having a control terminal for selecting either a connection forming of a low-pass filter or a connection of the capacitor 21 and the DC voltage source 19. Reference numeral 20 represents a switching control signal, and 34 a resistor, one end of which is connected to the switch 18 and the other end to the comparator 9. Numeral 37 represents means for initializing the low-pass filter 10 which consists of the switch 18 for connecting the DC voltage source 19 corresponding to an initial value to both ends of the capacitor 21 which constitutes the low-pass filter 10.

In the low-pass filter structured as described above, during periods of non-transmission the switch 18 is connected to the DC voltage source 19 for the purpose of preventing an undesirable charge from being accumulated in the capacitor 21 by the offset voltage of the comparator 9, and the low-pass filter 10 is thus preset to an initial state during the non-transmission period. Immediately before the start of transmission, the switch 18 is reconnected to the resistor 34 in the feedback path of the error voltage signal 32 of the automatic control circuit for the power amplifier so as to form the low-pass filter 10.

The switch 18 is shifted in response to the switching control signal 20. FIGS. 2A, 2B and 2C are timing charts showing the relationships between burst operation, the switching control signal 20 and the state of the capacitor 21 of the low-pass filter 10. In the burst operation, the voltage of the capacitor 21 begins to rise gradually immediately after the change from transmission to non-transmission. However, as the switch 18 is connected to the DC voltage source 19 in response to the switching control signal 20, the charge of the capacitor 21 is discharged quickly. At the time of commencement of transmission again, the switch 18 is connected to the side for forming the low-pass filter 10 in response to the switching control signal 20. Upon commencement of transmission, the low-pass filter 10 is thus in the initial state. The same operation is performed repeatedly.

EMBODIMENT 2

Figure 3:
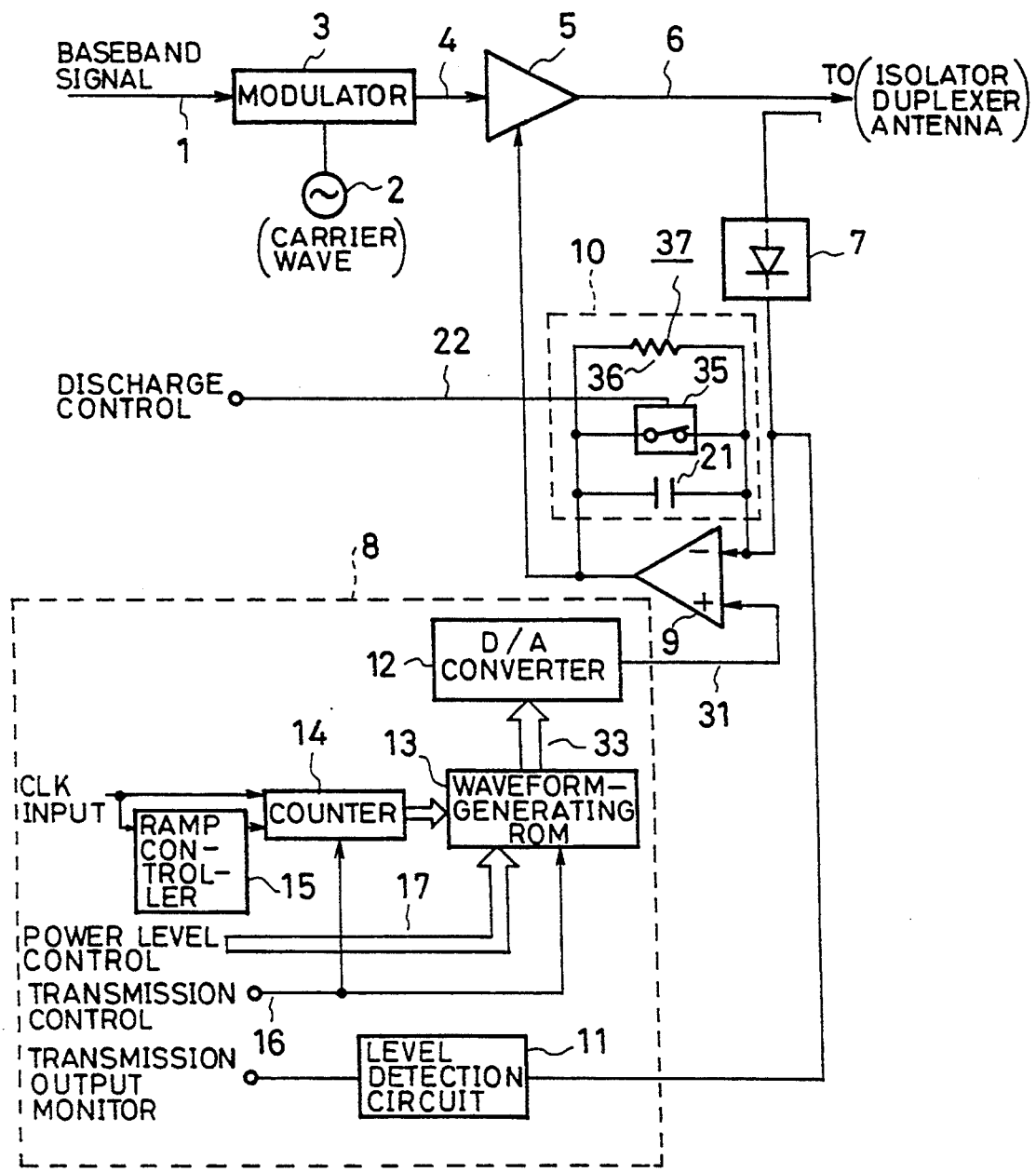
FIG. 3 is a diagram of an automatic control circuit for a power amplifier according to Embodiment 2 of the invention.

FIG. 3 shows another embodiment of the invention wherein the low-pass filter 10 is connected to the comparator 9. Reference numeral 35 represents an analog switch which is inserted into the low-pass filter in parallel to the capacitor 21 and controlled by a discharge control signal 22. The resistor 36 is connected to both ends of the capacitor 21 and the low-pass filter 10 comprises the capacitor 21 located between the negative input terminal and the output terminal of the comparator 9. The initializing means 37 comprises the analog switch 35 which discharges the charge of the capacitor 21. The same components as those of the prior art have the same reference numerals and their descriptions are omitted.

A description is subsequently given of the operation of this embodiment. When the automatic control circuit for a power amplifier is turned off at the time of non-transmission for the purpose of saving energy, an electric charge is accumulated in the capacitor 21 of the low-pass filter 10 connected to the comparator 9. Therefore, changes such as deformations and overshoots can arise in the waveform of the RF output signal 6 like the prior art. To cope with this, during burst operation, the analog switch 35 is closed in response to the discharge control signal 22 immediately before the start of transmission to discharge an accumulated charge by short-circuiting both ends of the capacitor 21 whereby rises in the RF output signal 6 can be optimized and stabilized. The charge of the capacitor 21 is discharged in response to the discharge control signal 22 and its timing is the same as that of the switching control signal 20 shown in FIGS. 2A, 2B and 2C. That is, when the signal becomes "HI", the switch 35 is closed, and when the signal becomes "LO", the switch 35 is opened.

EMBODIMENT 3

Figure 4:
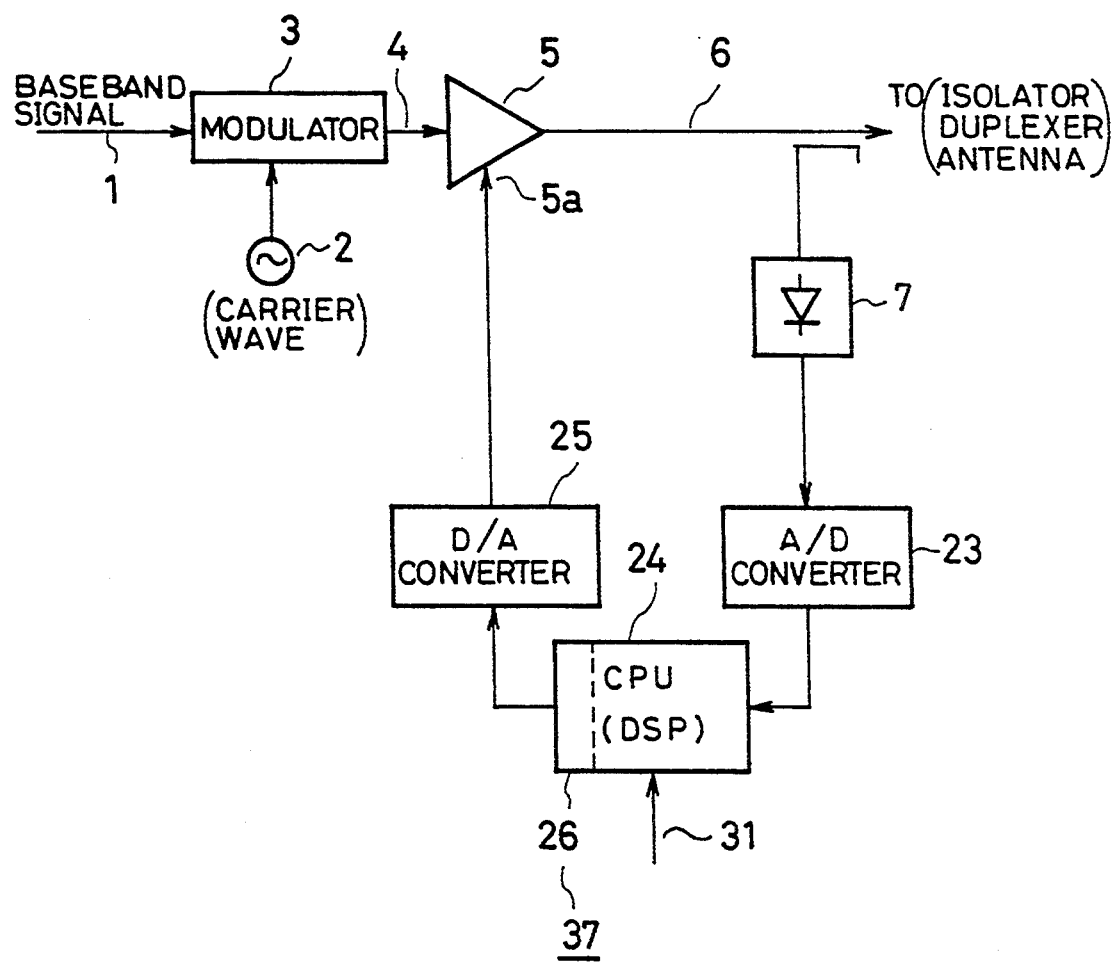
FIG. 4 is a diagram of an automatic control circuit for a power amplifier according to Embodiment 3 of the invention.
Figure 5:
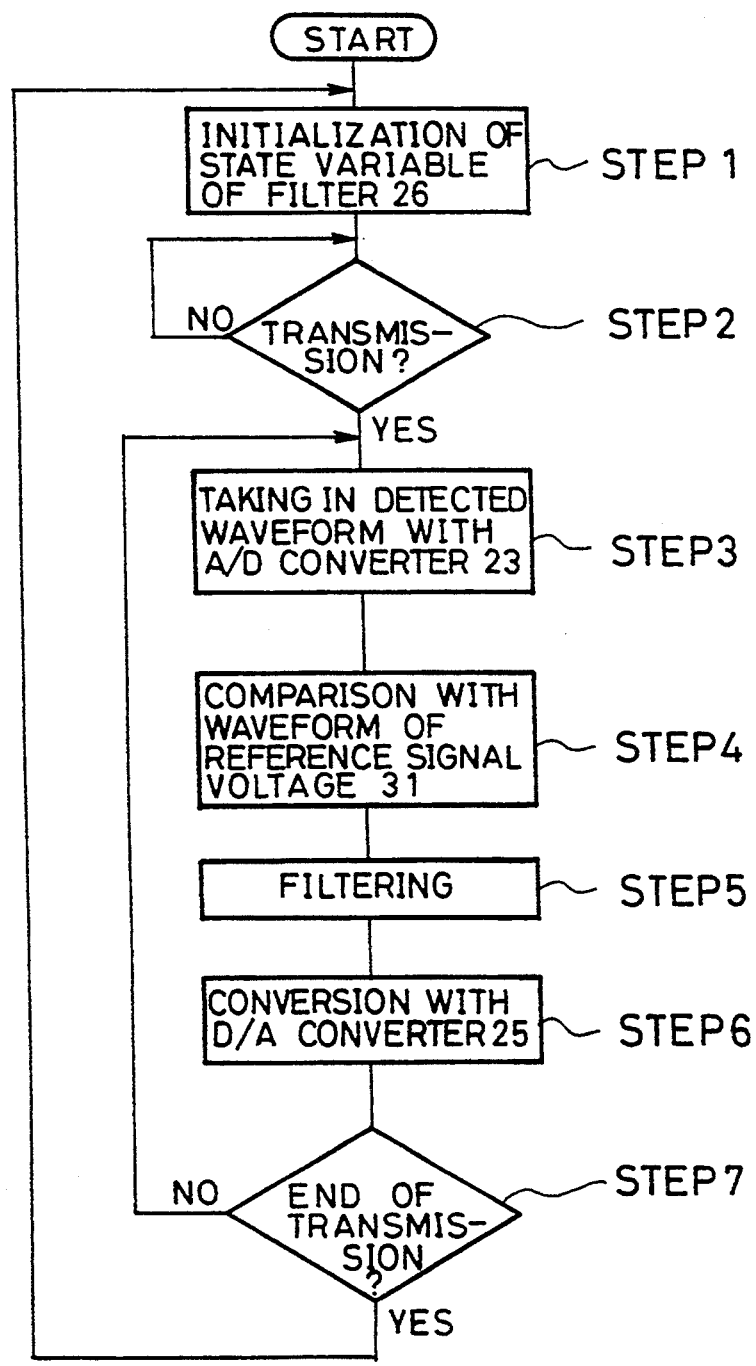
FIG. 5 is a flow chart showing the signal processing of Embodiment 3.

FIG. 4 shows an automatic control circuit for a power amplifier wherein a low-pass filter is not in hardware form, but a digital signal is processed by a digital signal processor (DSP) to achieve the same function as a low-pass filter. Reference numeral 23 represents an A/D converter which converts the waveform of the RF output signal 6 detected by the detector 7 into a digital value. Reference numeral 24 represents a CPU (DSP) for processing digitally the output of the A/D converter together with the reference signal voltage 31 and including a digital filter 26. Reference numeral 25 designates a D/A converter for converting the output of the CPU 24 into an analog value to be supplied to a terminal 5a. The same components as those of the prior art have the same reference numerals and their descriptions are omitted. A description is subsequently given of the operation of this embodiment with reference to the flow chart of FIG. 5. In step 1, the state variable of the digital filter 26 is first initialized by the CPU 24, and in step 2, whether or not there is transmission is checked. If there is transmission, the process goes to step 3 wherein the detected waveform is taken in by the A/D converter 23. The detected waveform data is compared with the waveform data of the reference signal voltage 31 in step 4, the error signal output thereafter is filtered by the initialized digital filter 26 in step 6, and the filtered signal is then converted into an analog value again by the D/A converter 25 in step 6 to be fed back to the power amplifier 5. In step 7, the process returns to step 3 unless transmission is ended, or to step 1 to initialize the digital filter 26 if transmission is ended. Thereby, the unspecified variable of the digital filter 26 is initialized immediately before the start of transmission, thus making it possible to eliminate unstable response of the filter and to effect the optimal and stable rise in the waveform of the RF output signal 6.

As described on the foregoing pages, according to the first aspect of the invention, since the low-pass filter is initialized before transmission, it is possible to eliminate the accumulation of an undesirable charge in the capacitor of the low-pass filter at the time of non-transmission during burst operation. Furthermore, when the automatic control circuit for a power amplifier is turned off at the time of non-transmission for the purpose of saving energy, it is also possible to eliminate the accumulation of an undesirable charge in the capacitor. For this reason, accurate gain control of the power amplifier is possible, and undesirable changes in the waveform of the RF output signal such as deformed rises and overshoots can be eliminated. Moreover, even if an offset voltage or the like is generated in the comparator, optimal and stable control of transmission output is possible.

According to the second aspect of the invention, since means for initializing the low-pass filter consists of a circuit for connecting a DC voltage source corresponding to an initial value to both ends of the capacitor which constitutes the low-pass filter, optimal and stable control of transmission output is possible.

According to the third aspect of the invention, since the low-pass filter comprises the capacitor located between the negative input terminal and the output terminal of the comparator and is initialized by short-circuiting the capacitor with a switch, optimal and stable control of transmission output is possible.

According to the fourth aspect of the invention, since the digital filter for processing a digital signal in the CPU is used as a low-pass filter and initialized immediately before the start of transmission, optimal and stable control of transmission output is possible.

What is claimed is:

1. An automatic control circuit for a power amplifier system comprising a power amplifier for amplifying a radio frequency, a detector for detecting the envelope waveform of a radio frequency output signal amplified by said power amplifier, a comparator for detecting the difference between the detected waveform and the waveform of a reference signal voltage from a reference signal voltage generator, and a low-pass filter for filtering the output of said comparator to be supplied to the gain control terminal of said power amplifier, characterized in that the circuit further comprises means for initializing said low-pass filter to set said low-pass filter in a preselected initial condition prior to the start of transmission.

2. The automatic control circuit for a power amplifier system according to claim 1 wherein said means for initializing said low-pass filter comprises a circuit for electrically connecting a DC voltage source corresponding to an initial value to both ends of a capacitor which constitutes said low-pass filter.

3. The automatic control circuit for a power amplifier system according to claim 1 wherein said low-pass filter comprises a capacitor located between the negative input terminal and the output terminal of said comparator and said means for initializing said low-pass filter comprises a switch for discharging said capacitor.

4. An automatic control circuit for a power amplifier system having a power amplifier and a detector for detecting the envelope waveform of a radio frequency output signal amplified by said power amplifier, which processes the output of said detector as a digital signal through an A/D converter, CPU and D/A converter and feeds back the digital signal to the gain control terminal of said power amplifier, characterized in that the circuit comprises a digital filter as a low-pass filter for processing a digital signal in said CPU and comprises means for initializing said digital filter to set said digital filter in a preselected condition immediately before the start of transmission.

5. The automatic control circuit for a power amplifier system according to claim 1 wherein said reference signal voltage generator comprises a D/A converter for converting digital data into analog data to output a reference signal voltage, a ROM for storing data to be supplied to said D/A converter, a counter for specifying an address in said ROM, and a controller for outputting a signal for controlling a transmission waveform at the start and end of burst transmission to said counter.

6. The automatic control circuit for a power amplifier system according to claim 1 wherein said low-pass filter comprises a capacitor located between the negative input terminal and the output terminal of said comparator and wherein said means for initializing said low-pass filter comprises an analog switch for discharging a charge in said capacitor.

* * * * *